(12) United States Patent
Zhan et al.

(10) Patent No.: US 11,784,624 B2
(45) Date of Patent: Oct. 10, 2023

(54) DIFFERENTIAL RESONATOR AND MEMS SENSOR

(71) Applicant: AAC ACOUSTIC TECHNOLOGIES (SHENZHEN) CO., LTD., Shenzhen (CN)

(72) Inventors: Zhan Zhan, Shenzhen (CN); Yang Li, Shenzhen (CN); Yuwei Liu, Singapore (SG); Qiuyu Tan, Singapore (SG); Rui Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 715 days.

(21) Appl. No.: 16/986,306

(22) Filed: Aug. 6, 2020

(65) Prior Publication Data
US 2020/0412325 A1 Dec. 31, 2020

Related U.S. Application Data

(63) Continuation of application No. PCT/CN2019/093340, filed on Jun. 27, 2019.

(51) Int. Cl.
*H03H 9/02* (2006.01)
*H03H 9/09* (2006.01)

(52) U.S. Cl.
CPC .......... *H03H 9/02433* (2013.01); *H03H 9/09* (2013.01); *H03H 2009/0248* (2013.01); *H03H 2009/02291* (2013.01)

(58) Field of Classification Search
CPC ................. H03H 9/02433; H03H 9/09; H03H 2009/02291; H03H 2009/0248
See application file for complete search history.

(56) References Cited

U.S. PATENT DOCUMENTS

| | | | | |
|---|---|---|---|---|
| 7,119,636 B2* | 10/2006 | Nguyen | ............... | H03H 9/2436 |
| | | | | 333/186 |
| 7,227,432 B2* | 6/2007 | Lutz | ...................... | H03H 9/505 |
| | | | | 310/309 |

(Continued)

FOREIGN PATENT DOCUMENTS

| | | | |
|---|---|---|---|
| CN | 101403615 A | * | 4/2009 |
| CN | 105300368 A | * | 2/2016 |

(Continued)

*Primary Examiner* — Adam D Houston
(74) *Attorney, Agent, or Firm* — W&G Law Group (57) ABSTRACT

The present disclosure provides a differential resonator and a MEMS sensor. The differential resonator includes a substrate, a first resonator, a second resonator and a coupling mechanism. The first resonator is connected with the second resonator, and the first resonator and the second resonator are movably connected with the substrate. The coupling mechanism includes a first guide beam, a second guide beam, a first coupling beam, a second coupling beam, a first connecting piece and a second connecting piece. The first guide beam and the second guide beam are arranged on two opposite sides of a direction perpendicular to a vibration direction of the first resonator or the second resonator. The first coupling beam is connected with the first guide beam, the second guide beam and the first resonator. The second coupling beam is connected with the first guide beam, the second guide beam and the second resonator.

14 Claims, 6 Drawing Sheets

(56) References Cited

U.S. PATENT DOCUMENTS

| | | | | |
|---|---|---|---|---|
| 7,808,332 B1* | 10/2010 | Pedersen | | H03H 9/02259 |
| | | | | 333/197 |
| 8,749,315 B2* | 6/2014 | Pedersen | | H03H 9/02259 |
| | | | | 333/197 |
| 10,418,967 B2* | 9/2019 | Nakagawa | | H03H 3/02 |
| 10,771,042 B2* | 9/2020 | Gattere | | H03H 9/2431 |
| 11,545,959 B1* | 1/2023 | Pedersen | | H03H 9/02433 |
| 2004/0113722 A1* | 6/2004 | Bircumshaw | | H03H 9/2405 |
| | | | | 333/197 |
| 2004/0207492 A1* | 10/2004 | Nguyen | | H03H 9/2436 |
| | | | | 333/199 |
| 2008/0150655 A1* | 6/2008 | Hagelin | | H03H 9/2484 |
| | | | | 333/200 |
| 2009/0140443 A1* | 6/2009 | Hohlfeld | | H02N 1/08 |
| | | | | 438/669 |
| 2012/0262026 A1* | 10/2012 | Lin | | B81B 3/0072 |
| | | | | 310/300 |
| 2014/0252509 A1* | 9/2014 | Merassi | | B81B 3/0072 |
| | | | | 257/415 |
| 2017/0108530 A1* | 4/2017 | Tocchio | | G01P 1/00 |
| 2017/0318385 A1* | 11/2017 | Harney | | H04R 19/04 |
| 2018/0339898 A1* | 11/2018 | Gattere | | B81B 3/0021 |
| 2020/0412324 A1* | 12/2020 | Zhan | | H03H 9/09 |
| 2020/0412325 A1* | 12/2020 | Zhan | | H03H 9/02433 |

FOREIGN PATENT DOCUMENTS

| | | | | |
|---|---|---|---|---|
| CN | 206469877 U | * | 9/2017 | |
| CN | 109374927 A | * | 2/2019 | |
| CN | 110311648 A | * | 10/2019 | H03H 9/02433 |
| CN | 110311649 A | * | 10/2019 | H03H 9/02433 |
| CN | 112600528 A | * | 4/2021 | |
| CN | 114679154 A | * | 6/2022 | |
| CN | 114719834 A | * | 7/2022 | |
| CN | 111490740 B | * | 1/2023 | H03H 3/02 |
| CN | 115615416 A | * | 1/2023 | |
| WO | WO-2022069545 A1 | * | 4/2022 | |

* cited by examiner

Micro Electromechanical
Systems (MEMS)

Differential
Resonator

FIG. 8

DIFFERENTIAL RESONATOR AND MEMS SENSOR

TECHNICAL FIELD

The present disclosure relates to the field of micro electromechanical systems (MEMS) sensor technology, in particular to a differential resonator and a MEMS sensor.

BACKGROUND

Differential resonator has a higher quality factor, which can suppress common-mode interference with external acceleration, vibration, temperature, and etc., and can effectively lower circuit noise level. Therefore, adopting a differential motion mode is an optimized mainstream solution to improve the performance of MEMS sensors.

Figure 1:
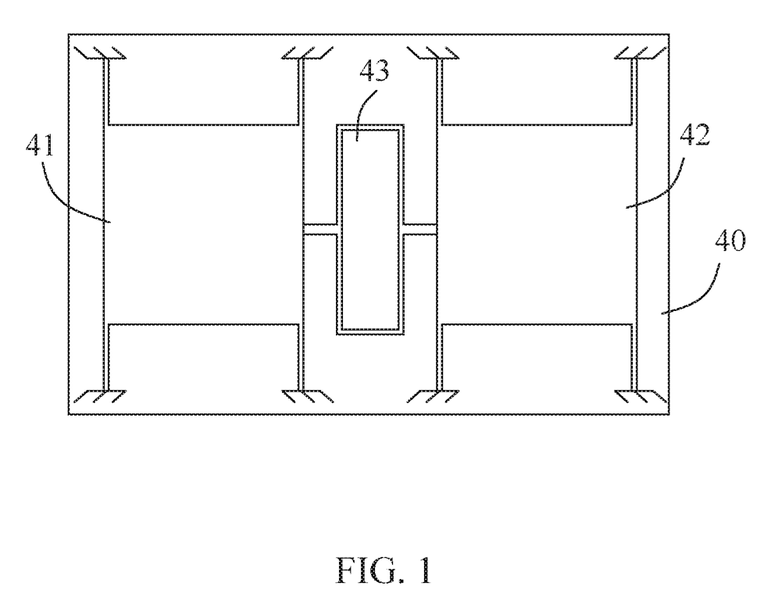
FIG. 1 is a schematic diagram of a plane structure of a differential resonator in the existing technology.
Figure 2:
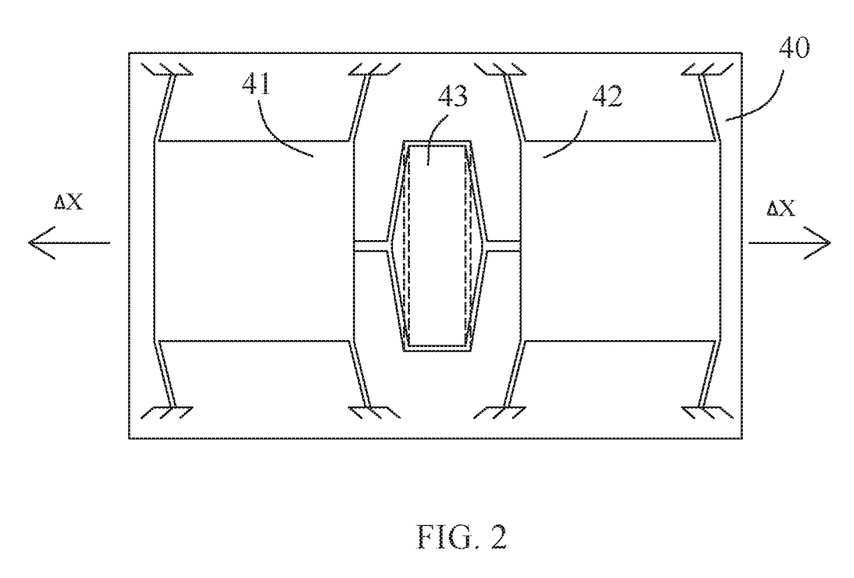
FIG. 2 is a schematic diagram of a plane structure of the differential resonator during vibration in the existing technology in an ideal state.

As shown in FIG. 1 to FIG. 2, the traditional differential resonator 4 includes a first resonator 41, a second resonator 42, a coupling mechanism 43 connecting the first resonator 41 and the second resonator 42, and a substrate 40. Herein, the first resonator 41, the second resonator 42 and the coupling mechanism 43 connecting the first resonator 41 and the second resonator 42 are all fixed to the substrate 40, and the first resonator 41 and the second resonator 42 are of the same amplitude-frequency response characteristics, that is, it is necessary to ensure that the geometric dimensions of the first resonator 41 and the second resonator 42 are almost identical. The coupling mechanism 43 adopts a rectangular coupling beam. By stretching or contracting of the rectangular coupling beam, the first resonator 41 and the second resonator 42 are reversely associated. The differential motion mode that the first resonator 41 and the second resonator 42 driven by a same external force are mutually reversely displaced by ΔX in the vibration direction is realized.

However, in the manufacturing process of the differential resonator 4, it is not possible to achieve that the geometric dimensions of the first resonator 41 and the second resonator 42 are almost identical.

Figure 3:
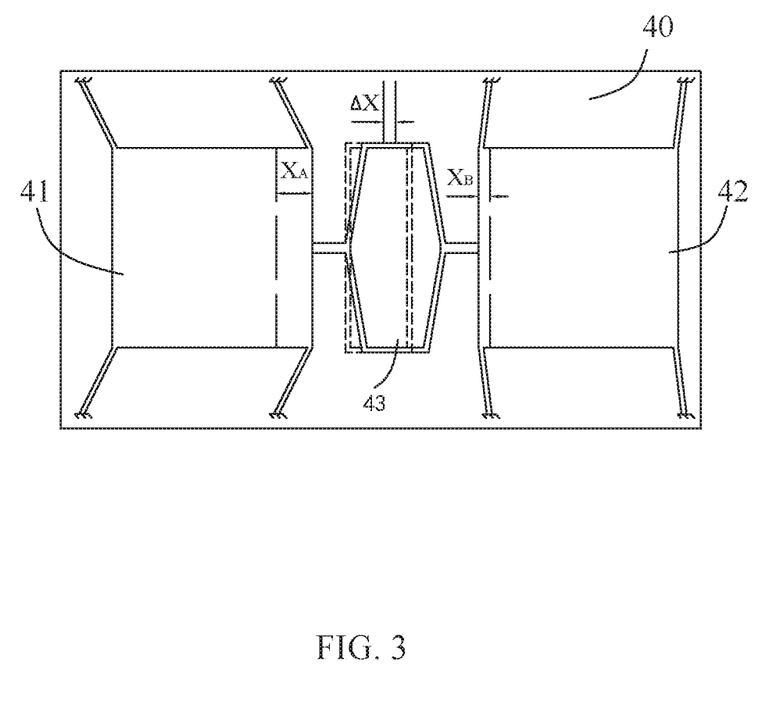
FIG. 3 is a schematic diagram of a plane structure of the differential resonator during vibration in the existing technology in an actual state.

As shown in FIG. 3, driven by the same external force, the first resonator 41 and the second resonator 42 may produce different amplitude outputs. That is, the displacements $X_A$, $X_B$ of the first resonator 41 and the second resonator 42 in the same vibration direction are different, $Y_A \neq Y_B$, which will force the coupling mechanism 43 to have a displacement of ΔX in the X direction where no contractarian is applied to the coupling mechanism 43. Thus, the rectangular coupling mechanism is weak in correcting the difference between $X_A$ and $X_B$. Therefore, the traditional differential resonator has disadvantages such as low process robustness, small quality factor, and poor capability for suppression of common-mode interference.

Therefore, how to improve the process robustness of the differential resonator so as to enhance the quality factor and the capability for suppression of common-mode interference of the differential resonator is an urgent technical problem to be solved by those skilled in the art.

SUMMARY

The present disclosure provides a differential resonator and a MEMS sensor, aiming at improving a quality factor of the differential resonator so as to enhance a common-mode interference suppression capability of the differential resonator.

In order to achieve the above purpose, the present disclosure provides a differential resonator. The differential resonator includes a substrate, a first resonator, a second resonator and a coupling mechanism. The first resonator is connected with the second resonator through the coupling mechanism, and the first resonator and the second resonator are connected with the substrate and are able to be displaced relative to the substrate under an external force, and a direction in which the first resonator is displaced and a direction where the second resonator is displaced are opposite to each other. The coupling mechanism includes a first guide beam, a second guide beam, a first coupling beam, a second coupling beam, a first connecting piece and a second connecting piece. The first guide beam and the second guide beam are arranged on opposite sides of a direction perpendicular to a vibration direction of the first resonator or the second resonator. The first coupling beam has one end connected with the first guide beam, one other end connected with the second guide beam, and a middle portion connected with the first resonator through the first connecting piece. The second coupling beam has one end connected with the first guide beam, one other end connected with the second guide beam, and a middle portion connected with the second resonator through the second connecting piece.

As an improvement, the first coupling beam has the end connected with a middle portion of the first guide beam in the vibration direction, and the other end connected with a middle portion of the second guide beam in the vibration direction; amd the second coupling beam has the end connected with the middle portion of the first guide beam in the vibration direction, and the other end connected with the middle portion of the second guide beam in the vibration direction.

As an improvement, the first coupling beam and the second coupling beam are symmetrically arranged about the direction perpendicular to the vibration direction to form an annular coupling beam.

As an improvement, the annular coupling beam is a circular coupling beam, a diamond coupling beam or an elliptical coupling beam.

As an improvement, a distance between the first coupling beam and the second coupling beam in the vibration direction gradually decreases from the middle to both sides.

As an improvement, both the first guide beam and the second guide beam are made of an elastic material.

As an improvement, the first guide beam, the second guide beam, the first coupling beam, the second coupling beam, the first connecting piece and the second connecting piece are integrally formed to form the coupling mechanism.

In order to achieve the above purpose, the present disclosure further provides a MEMS sensor. The MEMS sensor includes the aforementioned differential resonator.

Compared with the existing technology, the differential resonator and MEMS sensor provided in the present disclosure have the following advantages:

The first guide beam and the second guide beam are arranged on two opposite sides of the vibration direction of the first resonator or the second resonator. The first resonator is connected with the first guide beam and the second guide beam through the first coupling beam, and the second resonator is connected with the first guide beam and the second guide beam through the second coupling beam, limiting positions of the first resonator and the second resonator through the first guide beam and the second guide beam when the first resonator and the second resonator vibrate, so that when the first resonator or the second resonator is driven by the external force to vibrate, the amplitude consistency between them is better.

The annular coupling beam structure is provided. With the characteristics that the common-mode stiffness of the annular coupling structure is greater than the differential-mode stiffness, in cooperation with the first guide beam and the second guide beam performing guiding functions, the process error is better suppressed and the process robustness of the differential resonator is improved.

DETAILED DESCRIPTION

In order to make the purpose, the technical solution and the advantages of the present disclosure clearer, the present disclosure will be explained below in detail with reference to the accompanying drawings and embodiments. It should be understood that the specific embodiments described herein merely intend to explain the present disclosure rather than limit the present disclosure.

Figure 4:
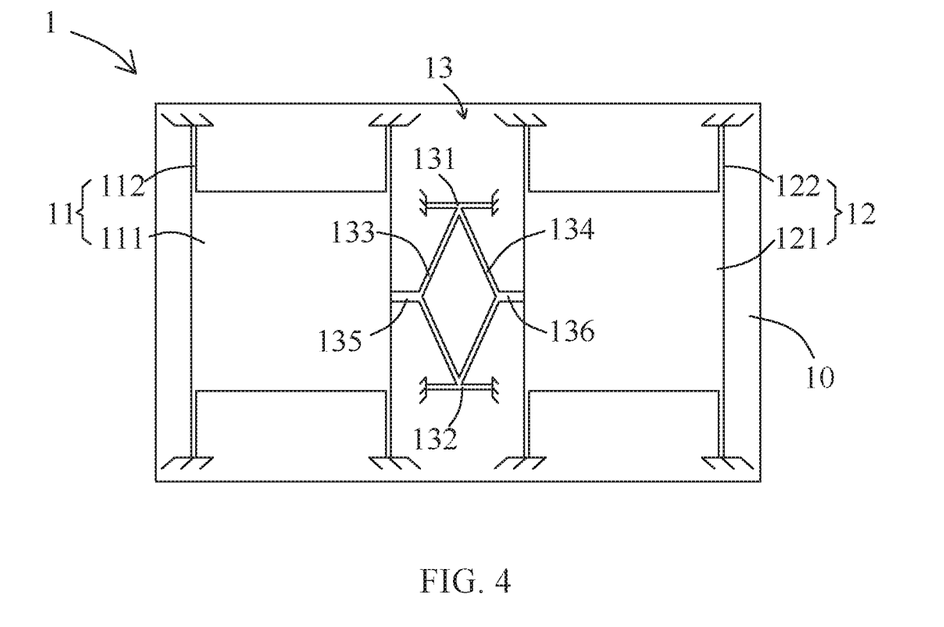
FIG. 4 is a schematic diagram of a plane structure of a differential resonator provided in the present disclosure.
Figure 5:
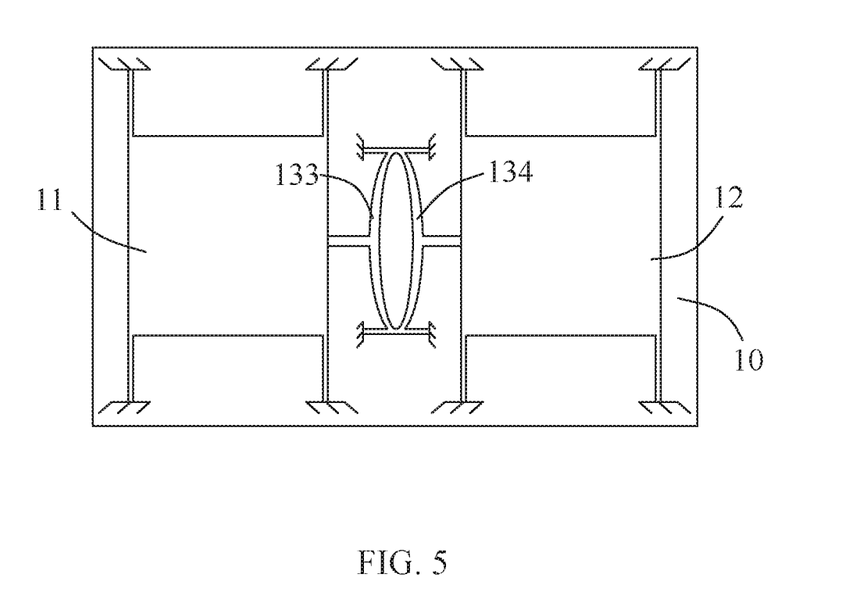
FIG. 5 is a schematic diagram of a plane structure of a modified structure of the differential resonator of the present disclosure.
Figure 6:
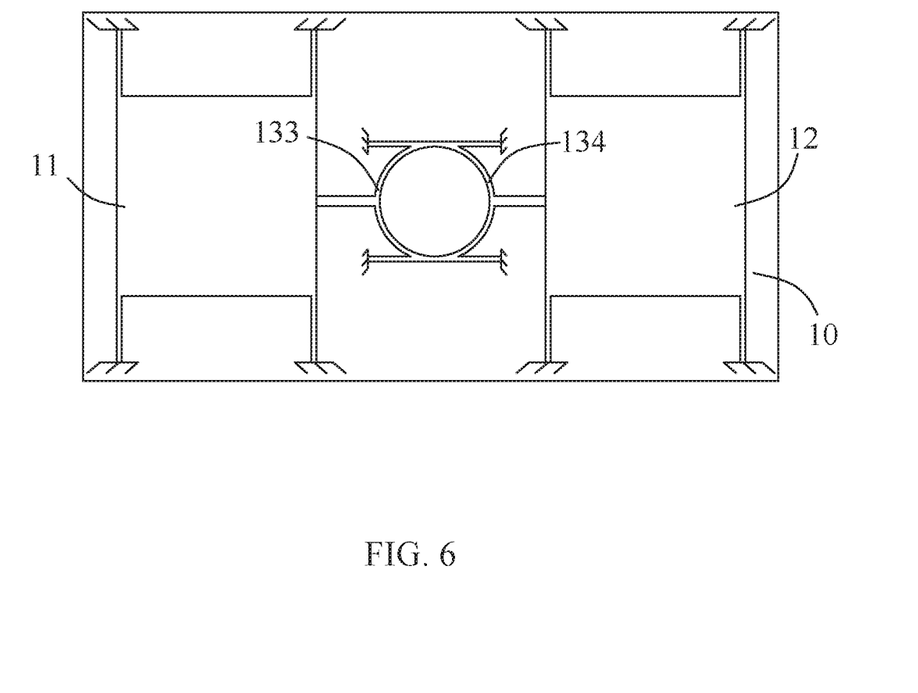
FIG. 6 is a schematic diagram of a plane structure of a further modified structure of the differential resonator of the present disclosure.

Referring to FIG. 4 to FIG. 6, the present disclosure provides a differential resonator 1. The differential resonator 1 includes a substrate 10, a first resonator 11, a second resonator 12 and a coupling mechanism 13. The first resonator 11 is connected with the second resonator 12 through the coupling mechanism 13, and the first resonator 11 and the second resonator 12 are connected with the substrate 10 and may be displaced relative to the substrate 10 under an external force.

Specifically, the first resonator 11 includes a first vibrator 111 and a plurality of first connecting arms 112. The plurality of first connecting arms 112 are arranged on two opposite sides of the first vibrator 111 perpendicular to a vibration direction of the first vibrator 111, and configured to connect the first vibrator 111 with the substrate 10. The plurality of first connecting arms 112 are flexible connecting arms.

The second resonator 12 includes a second vibrator 121 and a plurality of second connecting arms 122. The plurality of second connecting arms 122 are arranged on two opposite sides of the second vibrator 121 perpendicular to a vibration direction of the second vibrator 121, and configured to connect the second vibrator 121 with the substrate 10, where the vibration direction of the second vibrator 121 is opposite to that of the first vibrator 111. The plurality of second connecting arms 122 are flexible connecting arms or elastic connecting arms.

The coupling mechanism 13 includes a first guide beam 131, a second guide beam 132, a first coupling beam 133, a second coupling beam 134, a first connecting piece 135 and a second connecting piece 136. Herein, the first guide beam 131 and the second guide beam 132 are arranged on two opposite sides of a direction perpendicular to a vibration direction of the first resonator 11 or the second resonator 12.

The first coupling beam 133 has one end connected with the first guide beam 131, one other end connected with the second guide beam 132, and a middle portion connected with the first resonator 11 through the first connecting piece 135. The second coupling beam 134 has one end connected with the first guide beam 131, one other end connected with the second guide beam 132, and a middle portion connected with the second resonator 12 through the second connecting piece 136.

In some embodiments, the first guide beam 131 and the second guide beam 132 are both elastic guide beams made of elastic materials. The first coupling beam 133 has one end connected with a middle portion of the first guide beam 131 in the vibration direction, and one other end connected with a middle portion of the second guide beam 132 in the vibration direction. The second coupling beam 134 has one end connected with the middle portion of the first guide beam 131 in the vibration direction, and one other end connected with the middle portion of the second guide beam 132 in the vibration direction, so as to ensure a better amplitude consistency between the first resonator 11 and the second resonator 12.

In some embodiments, the first coupling beam 133 and the second coupling beam 134 are symmetrically arranged about the direction perpendicular to the vibration direction to form an annular coupling beam. The annular coupling beam may be a circular coupling beam, a diamond coupling beam or an elliptical coupling beam. The annular coupling beam has the characteristic that a stiffness of the coupling mechanism 13 in a common-mode vibration mode is smaller than that of the coupling mechanism 13 in a differential-mode vibration mode, which can better suppress a process error and improve a process robustness of the differential resonator.

In some embodiments, a distance between the first coupling beam 133 and the second coupling beam 134 in the vibration direction gradually decreases from the middle to both sides.

In some embodiments, the first guide beam 131, the second guide beam 132, the first coupling beam 133, the second coupling beam 134, the first connecting piece 135 and the second connecting piece 136 are integrally formed to form the coupling mechanism 13.

Figure 7:
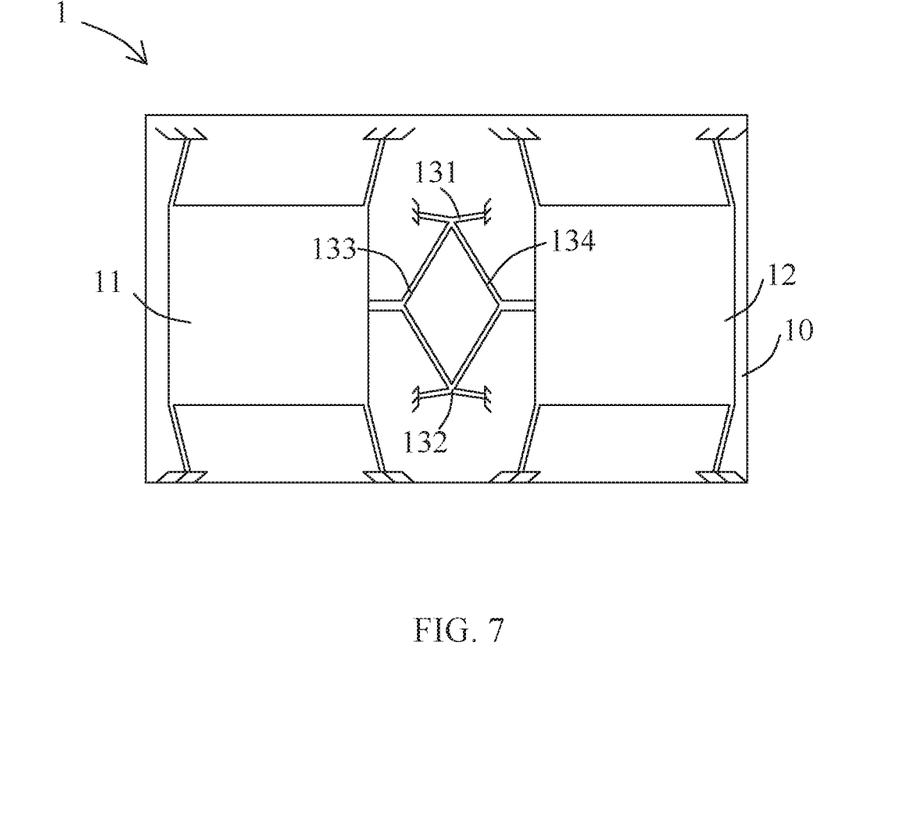
FIG. 7 is a schematic diagram of a plane structure of the differential resonator during vibration provided in the present disclosure.

Referring to FIG. 7, the first guide beam 131 and the second guide beam 132 are arranged on two opposite sides of the vibration direction of the first resonator 11 or the second resonator 12. The first resonator 11 is connected with the first guide beam 131 and the second guide beam 132 through the first coupling beam 133, and the second resonator 12 is connected with the first guide beam 131 and the second guide beam 132 through the second coupling beam 134, thus limiting positions of the first resonator 11 and the second resonator 12 through the first guide beam 131 and the second guide beam 132 when the first resonator 11 and the second resonator 12 vibrate, so that when the first resonator 11 or the second resonator 12 is driven by the external force to vibrate, the amplitude consistency between them is better.

At the same time, with the first guide beam 131 and second guide beam 132 performing guiding functions, the first coupling beam 133 and the second coupling beam 134 may be prevented from bending in the same direction in the vibration direction.

Further, with the characteristics that the common-mode stiffness of the annular coupling structure is greater than the differential-mode stiffness, in cooperation with the first guide beam 131 and the second guide beam 132 performing guiding functions, the process error is better suppressed and the process robustness of the differential resonator 1 is improved.

Figure 8:
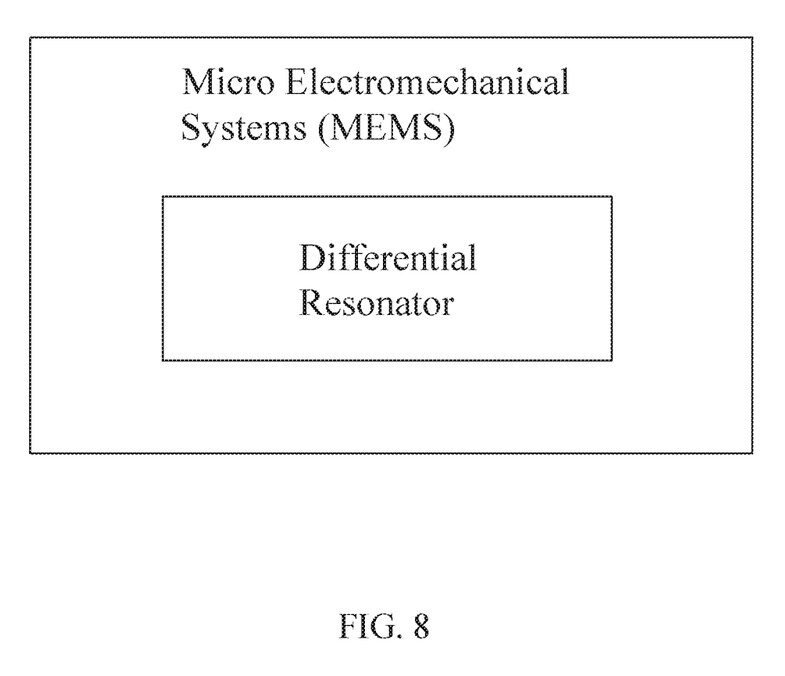
FIG. 8 is a schematic diagram of a micro electromechanical systems sensor provided in the present disclosure.

In some embodiments, the present disclosure further provides a MEMS sensor. The MEMS sensor includes the aforementioned differential resonator 1. The MEMS sensor may be a differential accelerometer, a differential gyroscope or a differential resonant pressure sensor.

Compared with the existing technology, the differential resonator and MEMS sensor provided in the present disclosure have the following advantages.

The first guide beam and the second guide beam are arranged on two opposite sides of the vibration direction of the first resonator or the second resonator. The first resonator is connected with the first guide beam and the second guide beam through the first coupling beam, and the second resonator is connected with the first guide beam and the second guide beam through the second coupling beam, limiting positions of the first resonator and the second resonator through the first guide beam and the second guide beam when the first resonator and the second resonator vibrate, so that when the first resonator or the second resonator is driven by the external force to vibrate, the amplitude consistency between them is better.

At the same time, with the first guide beam and second guide beam performing guiding functions, the first coupling beam and the second coupling beam may be prevented from bending in the same direction in the vibration direction.

The annular coupling beam structure is formed by the first coupling beam and the second coupling beam. With the characteristics that the common-mode stiffness of the annular coupling structure is greater than the differential-mode stiffness, in cooperation with the first guide beam and the second guide beam performing guiding functions, the process error is better suppressed and the process robustness of the differential resonator is improved.

The description above is merely embodiments of the present disclosure. It should be noted that those of ordinary skills in the art may make improvements without departing from the inventive concept of the present disclosure, such improvements, however, fall within the protection scope of the present disclosure.

What is claimed is:

1. A differential resonator, comprising a substrate, a first resonator, a second resonator and a coupling mechanism, the first resonator being connected with the second resonator through the coupling mechanism, and the first resonator and the second resonator being connected with the substrate and being able to be displaced relative to the substrate under an external force, and a direction in which the first resonator is displaced and a direction in which the second resonator is displaced being opposite to each other, wherein:

the coupling mechanism comprises a first guide beam, a second guide beam, a first coupling beam, a second coupling beam, a first connecting piece and a second connecting piece; the first guide beam and the second guide beam are arranged on opposite sides of a direction perpendicular to a vibration direction of the first resonator or the second resonator;

the first coupling beam has one end connected with the first guide beam, one other end connected with the second guide beam, and a middle portion connected with the first resonator through the first connecting piece; and the second coupling beam has one end connected with the first guide beam, one other end connected with the second guide beam, and a middle portion connected with the second resonator through the second connecting piece.

2. The differential resonator according to claim 1, wherein the first coupling beam has the end connected with a middle portion of the first guide beam in the vibration direction, and the other end connected with a middle portion of the second guide beam in the vibration direction; and the second coupling beam has the end connected with the middle portion of the first guide beam in the vibration direction, and the other end connected with the middle portion of the second guide beam in the vibration direction.

3. The differential resonator according to claim 1, wherein the first coupling beam and the second coupling beam are symmetrically arranged about the direction perpendicular to the vibration direction to form an annular coupling beam.

4. The differential resonator according to claim 3, wherein the annular coupling beam is a circular coupling beam, a diamond coupling beam or an elliptical coupling beam.

5. The differential resonator according to claim 3, wherein a distance between the first coupling beam and the second coupling beam in the vibration direction gradually decreases from the middle to both sides.

6. The differential resonator according to claim 1, wherein both the first guide beam and the second guide beam are made of an elastic material.

7. The differential resonator according to claim 1, wherein the first guide beam, the second guide beam, the first coupling beam, the second coupling beam, the first connecting piece and the second connecting piece are integrally formed to form the coupling mechanism.

8. A micro electromechanical systems sensor, comprising a differential resonator, the differential resonator comprising a substrate, a first resonator, a second resonator and a coupling mechanism, the first resonator being connected with the second resonator through the coupling mechanism, and the first resonator and the second resonator being connected with the substrate and being able to be displaced relative to the substrate under an external force, and a direction in which the first resonator is displaced and a direction in which the second resonator is displaced being opposite to each other, wherein:

the coupling mechanism comprises a first guide beam, a second guide beam, a first coupling beam, a second coupling beam, a first connecting piece and a second connecting piece; the first guide beam and the second guide beam are arranged on opposite sides of a direction perpendicular to a vibration direction of the first resonator or the second resonator;

the first coupling beam has one end connected with the first guide beam, one other end connected with the second guide beam, and a middle portion connected with the first resonator through the first connecting piece; and the second coupling beam has one end connected with the first guide beam, one other end connected with the second guide beam, and a middle portion connected with the second resonator through the second connecting piece.

9. The micro electromechanical systems sensor according to claim 8, wherein the first coupling beam has the end connected with a middle portion of the first guide beam in the vibration direction, and the other end connected with a middle portion of the second guide beam in the vibration direction; and the second coupling beam has the end connected with the middle portion of the first guide beam in the vibration direction, and the other end connected with the middle portion of the second guide beam in the vibration direction.

10. The micro electromechanical systems sensor according to claim 8, wherein the first coupling beam and the second coupling beam are symmetrically arranged about the direction perpendicular to the vibration direction to form an annular coupling beam.

11. The micro electromechanical systems sensor according to claim 10, wherein the annular coupling beam is a circular coupling beam, a diamond coupling beam or an elliptical coupling beam.

12. The micro electromechanical systems sensor according to claim 10, wherein a distance between the first coupling beam and the second coupling beam in the vibration direction gradually decreases from the middle to both sides.

13. The micro electromechanical systems sensor according to claim 8, wherein both the first guide beam and the second guide beam are made of an elastic material.

14. The micro electromechanical systems sensor according to claim 8, wherein the first guide beam, the second guide beam, the first coupling beam, the second coupling beam, the first connecting piece and the second connecting piece are integrally formed to form the coupling mechanism.

* * * * *